United States Patent [19]
Kuroki et al.

[11] Patent Number: 5,841,875
[45] Date of Patent: Nov. 24, 1998

[54] DIGITAL AUDIO SIGNAL PROCESSOR WITH HARMONICS MODIFICATION

[75] Inventors: Ryuichiro Kuroki; Tsugio Ito, both of Hamamatsu, Japan

[73] Assignee: Yamaha Corporation, Hamamatsu, Japan

[21] Appl. No.: 588,288

[22] Filed: Jan. 18, 1996

Related U.S. Application Data

[63] Continuation of Ser. No. 968,539, Oct. 29, 1992, abandoned.

[30] Foreign Application Priority Data

Oct. 30, 1991 [JP] Japan ..................................... 3-311609

[51] Int. Cl.$^6$ ........................................................ H03G 3/00
[52] U.S. Cl. ............................................... 381/61; 381/98
[58] Field of Search .................................. 381/61, 98, 63

[56] References Cited

U.S. PATENT DOCUMENTS

| | | | |
|---|---|---|---|
| 4,987,381 | 1/1991 | Butler | 381/61 |
| 4,991,218 | 2/1991 | Kramer | |
| 4,995,084 | 2/1991 | Prichard | 381/61 |

OTHER PUBLICATIONS

Advertisement on Oct., 1980 *Guitar Player*, p. 19, for Ibanez UE–400 and Service Manual for UE–400.

*Primary Examiner*—Forester W. Isen
*Attorney, Agent, or Firm*—Loeb & Loeb LLP

[57] ABSTRACT

The audio signal processor has a harmonics modifier for processing an input audio signal to produce an output audio signal. The harmonics modifier is comprised of translating means for sequentially translating the input audio signal into an address signal according to a sampled amplitude of the input audio signal. Memory means is provided for storing an input/output conversion table containing amplitude values in addressable manner. Conversion means operates for accessing the memory means in response to the address signal to effect input/output conversion to read out a sequence of the amplitude values which form the output audio signal containing desired harmonic components according to results of the input/output conversion.

24 Claims, 19 Drawing Sheets

Input/Output Characteristic Curve

Output

Input

Input/Output Characteristic Curve

DC bias

DIGITAL AUDIO SIGNAL PROCESSOR WITH HARMONICS MODIFICATION

This is a continuation of application Ser. No. 07/968,539, filed Oct. 29, 1992, now abandoned.

BACKGROUND OF THE INVENTION

The present invention relates to an audio signal processor having a harmonics modifier used in an audio amplifier of musical instruments such as a guitar for generating harmonics modification effect, and particularly relates to a digital harmonics modifier of the type producing the harmonics modification effect according to digital signal processing.

For example, the musical instrument amplifier such as a guitar amplifier operates not only to amplify an input audio signal, but also to suitably mix harmonic components into the input audio signal to generate a distortion sound having improved timbre expression which is suitable for realistic sound generation of various musical instruments.

Conventionally, there have been adopted two different methods of imparting harmonic components to the audio signal in the musical instrument amplifier. The first method utilizes a vacuum-tube amplifier to generate distortion in an audio signal waveform according to vacuum-tube characteristics. The second method utilizes a distortion circuit composed of a semiconductor device for clipping the signal waveform and an equalizer for adjusting frequency characteristics, thereby generating distortion in the signal waveform.

With regard to the first method utilizing the vacuum-tube amplifier, while the generated distortion has particularly good quality as to timbre, the use of vacuum-tube causes degradation in the durability and reliability at the amplifier. With regard to the second method utilizing the distortion circuit composed of the semiconductor device, while the durability and reliability is superior to the first prior art, satisfactory timbre or quality of the musical sound cannot be obtained. Additionally, these conventional amplifiers are comprised of an analog circuit which can generate only a fixed pattern of tones. A plurality of analog circuits are needed in order to generate different types of tones.

SUMMARY OF THE INVENTION

In view of the above noted drawbacks of the prior art, an object of the present invention is to provide a digital harmonics modifier being capable of generating a variety of tones containing variable harmonic components and featuring high durability and reliability. According to the invention, the digital audio signal processor has a harmonics modifier for processing an input audio signal to produce an output audio signal. The harmonics modifier comprises translating means for sequentially translating the input audio signal into an address signal according to a sampled amplitude of the input audio signal, memory means for storing an input/output conversion table containing amplitude values in addressable manner, and conversion means for accessing the memory means in response to the address signal to effect input/output conversion to read out a sequence of the amplitude values which form the output audio signal containing desired harmonic components according to results of the input/output conversion. In a preferred form, the inventive harmonics modifier has bias means for adding a direct current (DC) bias to the input audio signal according to an amplitude level thereof. The input/output conversion table is addressed for the signal processing based on a level-shifted input audio signal added with the DC bias so as to vary the harmonic component distribution or frequency spectrum. In another preferred form, a plurality of harmonics modifiers are connected in series to one another through a phase inverter so that an output of a preceding modifier is phase-inverted, and is then inputted into a succeeding modifier. In a further preferred form, there are provided a plurality of harmonics modifiers which include mixed ones having phase-inverting means and having no phase-inverting means. These mixed modifiers are connected in parallel to each other.

According to the first aspect of the invention, the harmonics modifier utilizes the input/output conversion table to conduct digital signal processing so as to add desired harmonic components to an arbitrary audio signal, thereby improving durability and reliability of the device. According to the second aspect of the invention, an input audio signal is superimposed with a DC bias prior to the input/output conversion so as to introduce more complex harmonic components to improve significantly variation of the harmonics modification, thereby realizing sophisticated distortion sounds comparable to those produced by the vacuum-tube type audio amplifier. According to the third aspect of the invention, a plurality of the harmonics modifiers are connected in series to one another with intermediate phase-inversion to thereby effect more complicated modification of the audio sound. According to the fourth aspect of the invention, a plurality of the harmonics modifiers are connected in parallel to each other with phase-inversion to thereby enable more complicated modification of the audio sound having realistic timbres comparable to those produced by the vacuum-tube type audio amplifier.

DETAILED DESCRIPTION OF EMBODIMENTS

Figure 1:
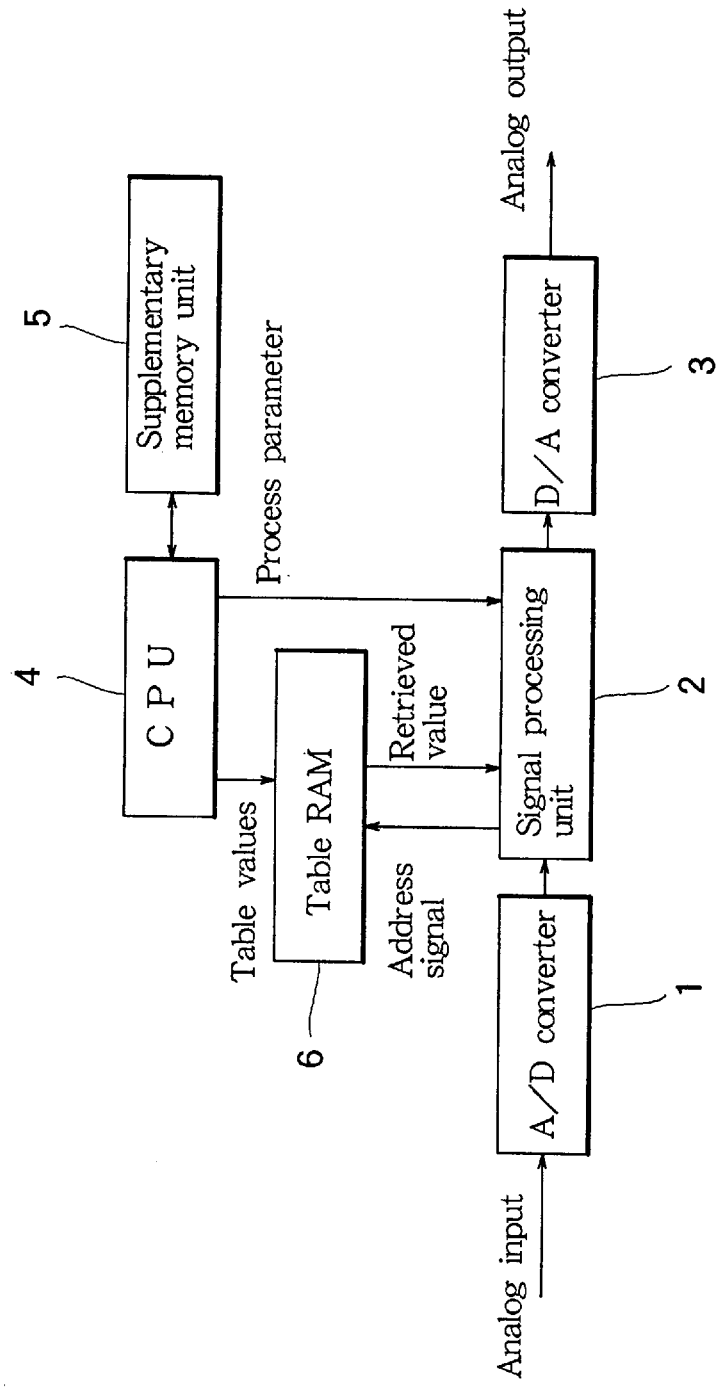
FIG. 1 is a block diagram showing a first embodiment of the inventive digital audio signal processor with a harmonics modifier.

Hereinafter, preferred embodiments of the invention will be described in conjunction with the drawings. FIG. 1 shows the first embodiment of the inventive digital audio signal processor, which features specific digital signal processing by accessing an input/output conversion table to generate harmonic components.

For the background information, in view of the good sound quality, an audio amplifier of a musical instrument is conventionally comprised of a vacuum-tube circuit, which characteristically features the following two aspects. Firstly, the vacuum-tube audio amplifier has a nonlinear input/output characteristic so that an output audio signal may contain harmonic components which are not contained in an input audio signal, even without clipping the output audio signal. Secondly, a grid current flows in the vacuum-tube as the input audio signal level increases so that a bias voltage superimposed to the input audio signal varies to thereby change harmonics distribution in the output audio signal.

The first feature of the vacuum-tube amplifier may significantly improve richness and fullness when amplifying and reproducing a clear sound which initially contains no positive harmonics. The second feature can significantly improve stiffness and strength when amplifying and reproducing a distortion sound which initially contains positive harmonics.

Accordingly, the present invention is directed to digital audio signal processing technology effective to realize such features of the vacuum-tube amplifier so as to generate good quality sounds suitable for musical instrument power amplification. The first embodiment shown in FIG. 1 is constructed for this purpose. In the figure, an analog input audio signal is converted into a corresponding digital signal by an analog/digital converter or A/D converter 1, and is then fed to a signal processing unit 2 which constitutes a harmonics modifier. The signal processing unit 2 carries out specific digital processing to produce a modified digital signal, which is then treated by a digital/analog converter or D/A converter 3 to produce a corresponding analog output audio signal. The signal processing unit 2 is controlled by a central processing unit or CPU 4. CPU 4 is provided with a supplementary memory unit 5. The signal processing unit 2 controlled by the CPU 4 converts the digital input signal sampled from the A/D converter 1 by using an input/output conversion table or look-up table stored in a random access memory or RAM 6 to effect the specific digital processing. The sampled data conversion of the input signal by the look-up table is undertaken such that the table RAM 6 is accessed sequentially by an address signal corrresponding to each sampled amplitude of the input audio signal to retrieve a sequence of registered amplitude values to provide an output digital signal. The contents of the input/output conversion table stored in the RAM 6 can be rewritten by the CPU 4 if desired. In case that there is no need to change the table contents, the look-up table may be stored in a Read-only memory or ROM.

Figure 2:
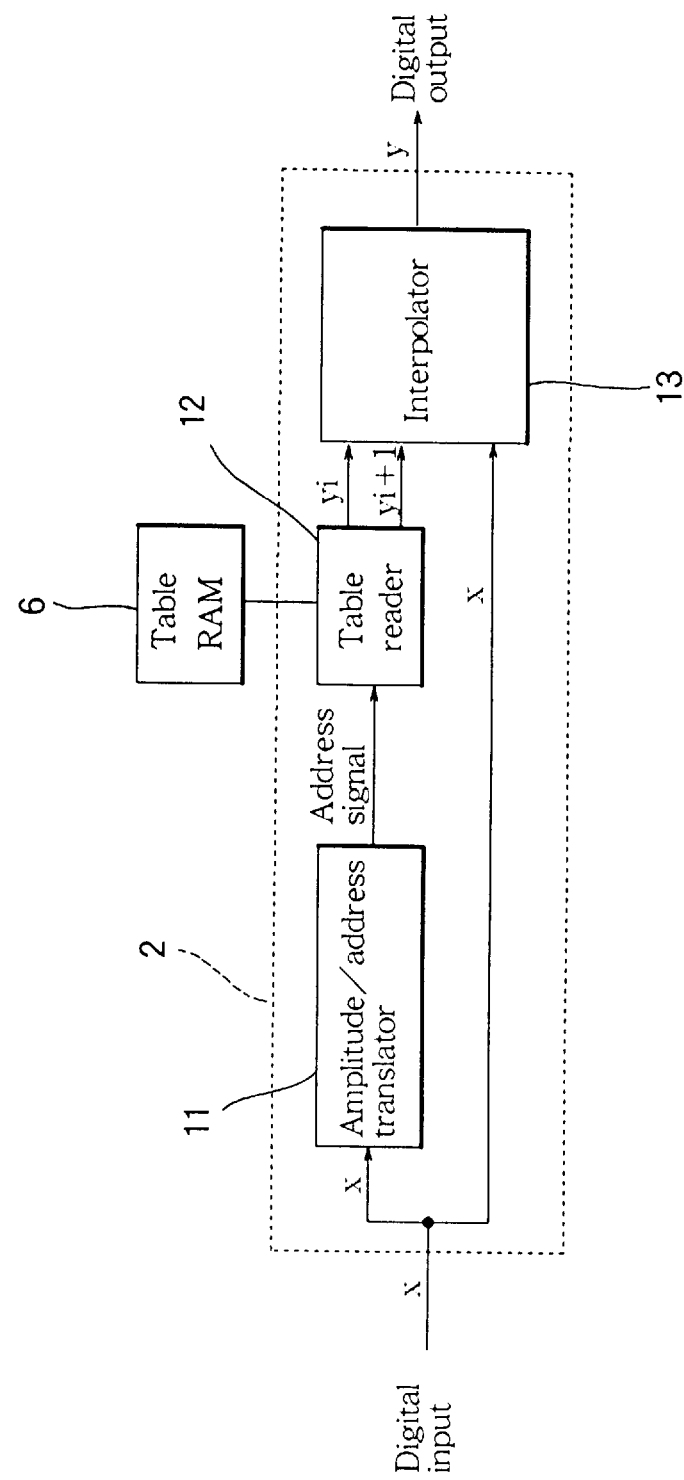
FIG. 2 is a detailed block diagram showing structure of the harmonics modifier in the FIG. 1 embodiment.

The signal processing unit 2 is comprised of an amplitude/address translator 11, a table reader 12 and an interpolator 13 as shown in FIG. 2. The amplitude/address translator 11 translates an input sample data x representative of an amplitude of the input audio signal to a corresponding address signal of the table RAM 6. The table reader 12 operates using this address signal to retrieve amplitude values yi and yi+$_1$ from the table RAM 6 at one sample sequence. These retrieved values yi and yi+$_1$ are fed to the interpolator 13 together with the input data x to effect interpolation of the first order to produce an output digital data y. In this embodiment, the linear interpolation is carried out by the Interpolator 13 to calculate the output digital data y in order to reduce a table size stored in the RAM 6. In FIG. 2, the input sample data is translated to a corresponding address value of the table RAM 6 by the amplitude/address translator 11. The reader 12 retrieves a table value stored in the designated address from the table RAM 6. In case that the RAM 6 stores a complete set of table values corresponding to the full range of the input sample data, the table size may be extremely expanded if each input data is composed of a great number of bits. In view of this, in the FIG. 2 structure, each sample data is divided into a set of higher order bits and another set of lower order bits. The higher bit set is used as the address value to access the conversion table to retrieve a pair of coarse table values. These table values are interpolated or truncated by the interpolator 13 based on the linear interpolation according to the divided lower bit set. Alternatively, the table RAM 6 may store fine table values corresponding directly to each of the sample data to enable direct input/output conversion, thereby eliminating the interpolator 13.

Figure 3A:
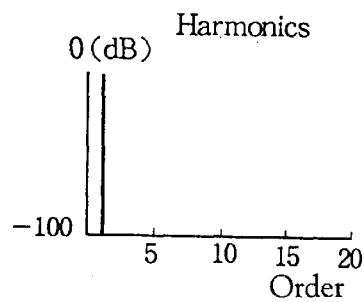
FIGS. 3(i a), 3(b) and 3(c) are diagrams showing harmonics distribution, output audio signal waveform and input/output linear characteristic curve, observed during the operation of the FIG. 1 embodiment in case that the input audio signal has a relatively small amplitude.
Figure 3B:
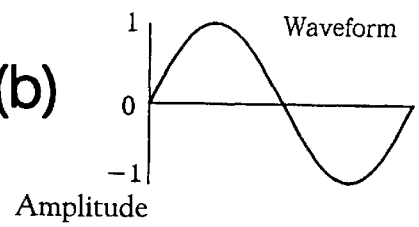
Figure 3C:
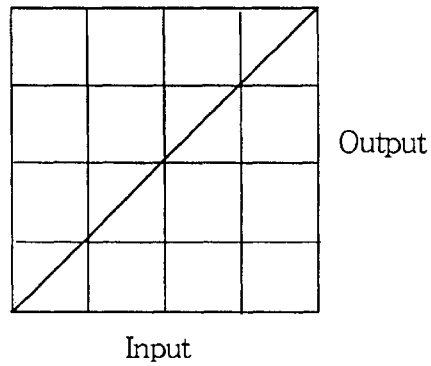
Figure 4A:
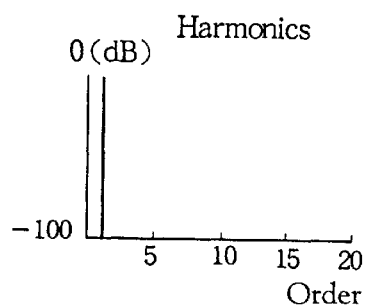
FIGS. 4(a), 4(b) and 4(c) are similar diagrams showing the operation of the FIG. 1 embodiment in case that the input audio signal has an intermediate amplitude.
Figure 4B:
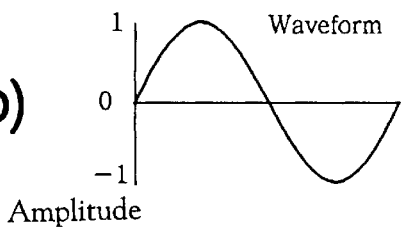
Figure 4C:
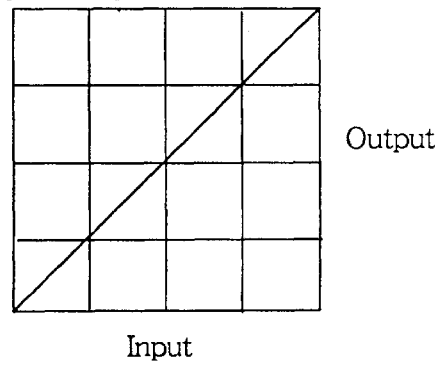
Figure 5A:
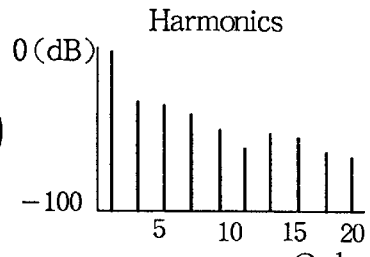
FIGS. 5(a), 5(b) and 5(c) are similar diagrams showing the operation of the FIG. 1 embodiment in case that the input audio signal has a relatively great amplitude.
Figure 5B:
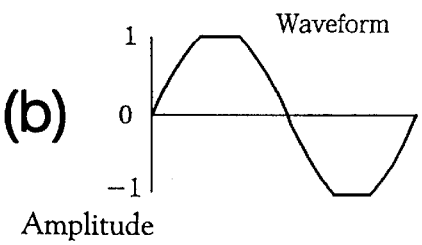
Figure 5C:
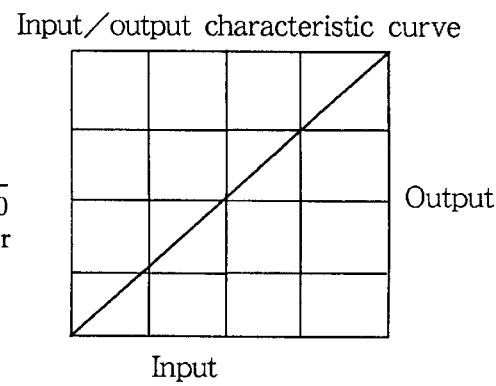
Figure 6A:
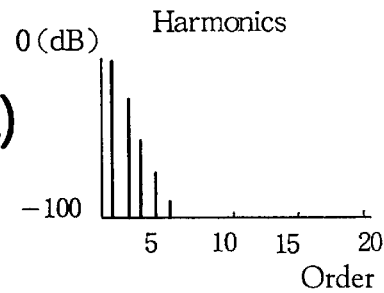
FIGS. 6(a), 6(b) and 6(c) are diagrams showing harmonies distribution, output audio signal waveform and input/output nonlinear characteristic curve, observed during the operation of the FIG. 1 embodiment in case of a relatively small input amplitude.
Figure 6B:
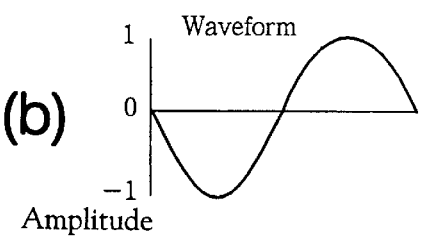
Figure 6C:
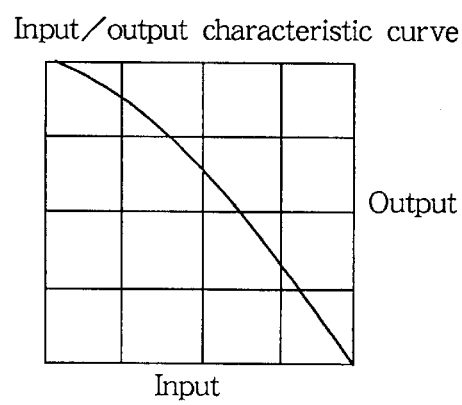
Figure 7A:
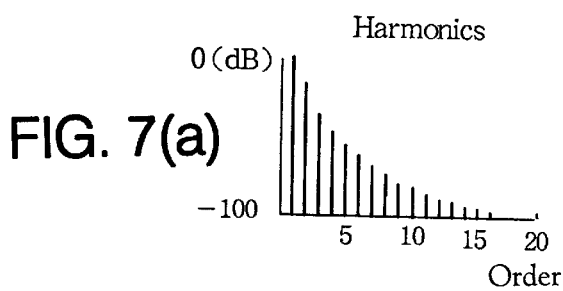
FIGS. 7(a), 7(b) and 7(c) are similar diagrams observed in case of an intermediate input amplitude.
Figure 7B:
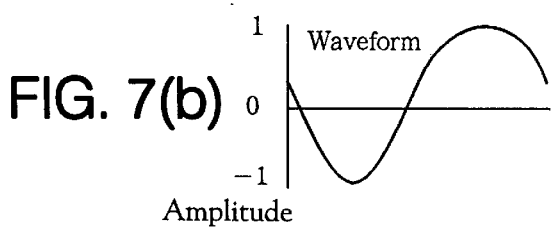
Figure 7C:
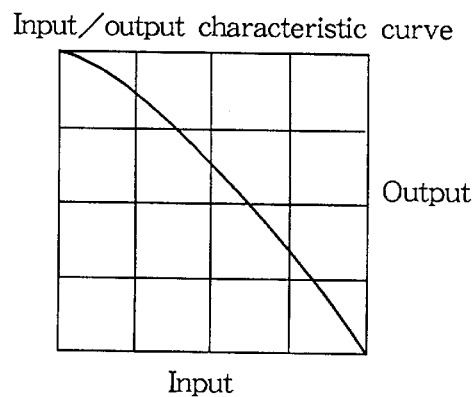
Figure 8A:
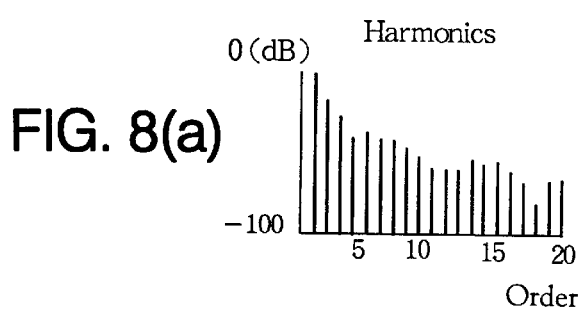
FIGS. 8(a), 8(b) and 8(c) are similar diagrams observed in case of a relatively great input amplitude.
Figure 8B:
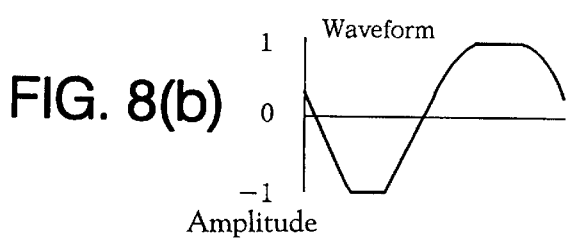
Figure 8C:
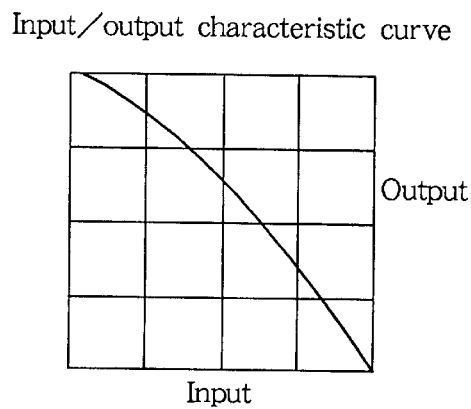

FIGS. 3–8 show various operation modes of the FIG. 1 embodiment, where FIGS. 3–5 modes are associated to linear input/output conversion with small, intermediate and great input amplitude levels, respectively, and FIGS. 6–8 modes are associated to nonlinear input/output conversion with small, intermediate and great input amplitude levels, respectively. As understood from these figures, in case that the digital modifier composed of the signal processing unit 2 and the table RAM 6 etc. has the linear input/output conversion characteristic, the output audio signal does not contain a harmonic component as long as the output audio signal is not clipped as in the FIGS. 3 and 4 cases. On the other hand, when the signal waveform is clipped as in the FIG. 5 case, there are abruptly generated various harmonic components. However, by providing an adequate conversion table having a nonlinear input/output characteristic, harmonic components are generated even if the input amplitude level is relatively small as shown in FIGS. 6–8. As the input amplitude level increases, the harmonic components are accordingly increased. These harmonic components may improve richness of reproduced clear sounds. Further, the use of the nonlinear conversion may avoid abrupt timbre change which would be caused by clipping.

Next, the description is given for the second embodiment of the inventive digital audio signal processor. This second embodiment is provided with an improved harmonies modifier in contrast to the first embodiment. The present embodiment features that a variable DC bias is applied to the input audio signal so as to produce various harmonic components from a prescribed conversion table. Further, the DC bias value is varied according to an amplitude level of the input audio signal so as to change harmonics distribution or frequency spectrum of the output audio signal.

Figure 9:
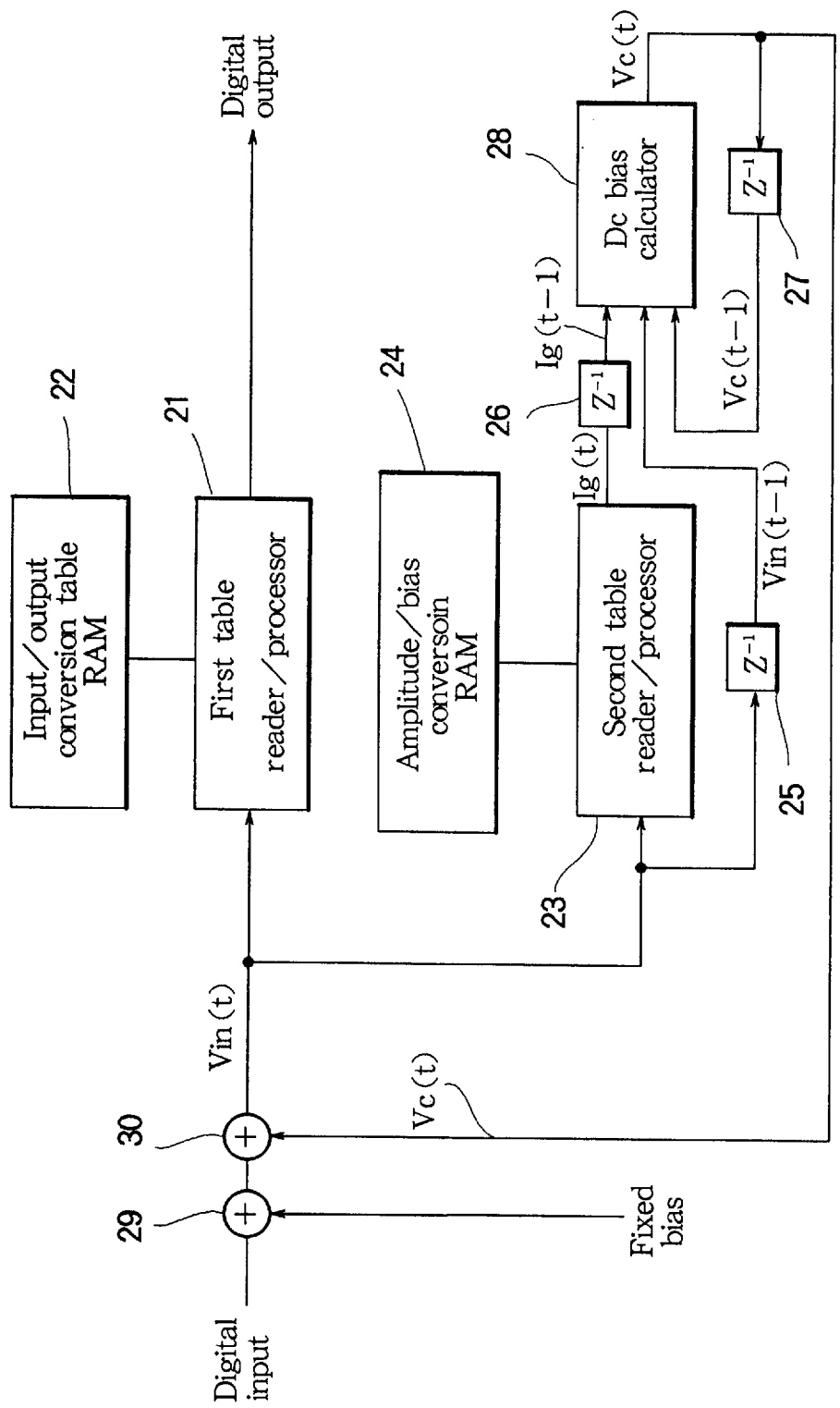
FIG. 9 is a block diagram showing a second embodiment of the inventive digital audio signal processor having a harmonics modifier with DC bias application.

Referring to FIG. 9, the improved harmonics modifier is comprised of a first table reader/processor 21, a first table RAM 22, a second table reader/processor 23, a second table RAM 24, data delaying units 25–27, a DC bias calculator 28 and adders 29, 30. The combination of the first table RAM 22 and the first table reader/processor 21 has the substantially same structure as the FIG. 1 harmonics modifier composed of the signal processing unit 2, CPU 4, supplementary memory unit 5 and table RAM 6. In the present embodiment, an initial input audio signal is converted into a digital form already by an A/D converter (not shown), and an output signal is given in a digital form which may be treated by a D/A converter if necessary in sound reproduction. The first table RAM 22 stores an input/output conversion table similar to that stored in the table RAM 6 of FIG. 1. The second table RAM 24 stores an amplitude/bias conversion table which represents or simulates an input-current/grid-current characteristic of a conventional vacuum-tube. The DC bias calculator 28 carries out the following Euler's integration to calculate a DC bias value Vc(t) based on those of a data Vin(t−1) which is obtained by delaying an input data Vin(t) through the delay circuit 25 by one sample timings another data Ig(t−1) which is obtained by delaying an output data Ig(t) of the second table reader/processor 23 through the delay circuit 26 by one sample timing, and a further data Vc(t−1) which is obtained by delaying the output data Vc(t) itself of the DC bias calculator 28 through the delay circuit 27 by one sample timing.

The Euler's integration is represented by:

$$Vc(t)=\{Ig(t-1)+[(Vin(t-1)-Vc(t-1))/Rg]\}/C \cdot Fs$$

where Fs denotes a sampling frequency.

Figure 10:
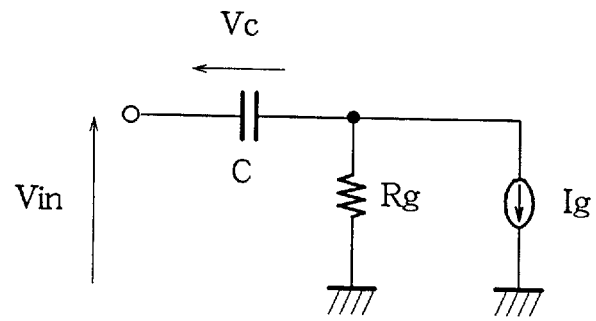
FIG. 10 is an equivalent circuit disgram showing the operation of DC bias calculation in the FIG. 9 embodiment.
Figure 11:
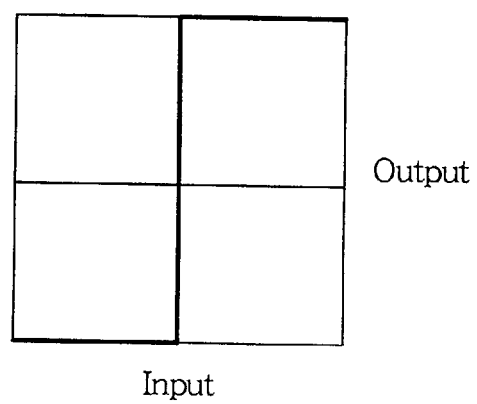
FIG. 11 is a diagram showing a characteristic curve of the input/output conversion table provided in the FIG. 9 embodiment.

The DC bias value calculated by the Euler's integration corresponds to a terminal voltage Vc of a capacitor C when feeding an input voltage Vin to an equivalent circuit of FIG. 10 which simulates a vacuum-tube and which comprises the capacitor C, a resistor Rg and an electric current source Ig. Referring back to FIG. 9, the input signal is added with a fixed bias by the adder 29, and is further added with the DC bias Vc(t) calculated by the DC bias calculator 28 through the other adder 30 to thereby provide the digital input Vin(t) which is given to the first table reader/processor 21. By such operation, the table reader/processor 21 sequentially retrieves an output data stored in the table RAM 22 according to the input Vin(t) added with the DC bias to produce the digital output signal. In this embodiment, the input signal is provisionally added with the fixed bias which is set to a center level of a desired bias range. Further, the DC bias is added, which varies around the center level according to the amplitude of the input signal.

Figure 12:
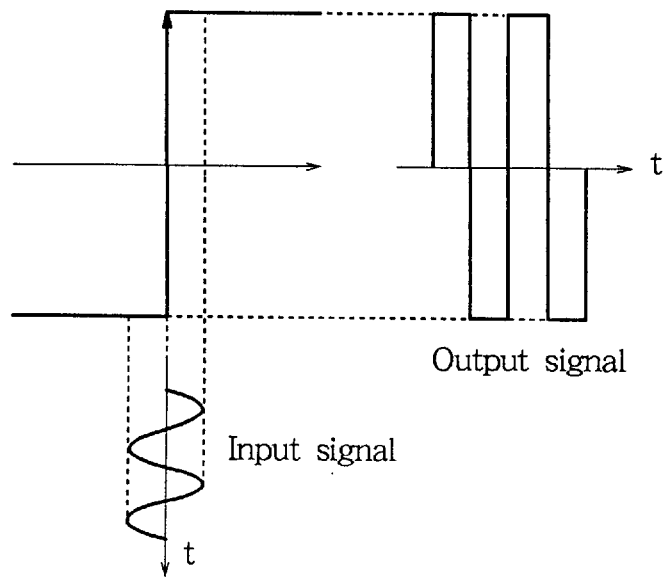
FIG. 12 is a diagram showing the operation of the input/output conversion in case that the input audio signal has a relatively small amplitude without DC bias in the FIG. 9 embodiment.
Figure 13:
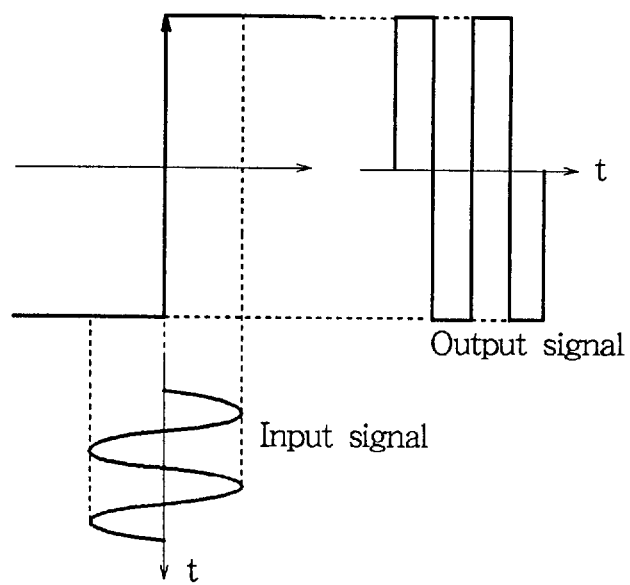
FIG. 13 is a similar operational diagram in case of an intermediate input amplitude without DC bias.
Figure 14:
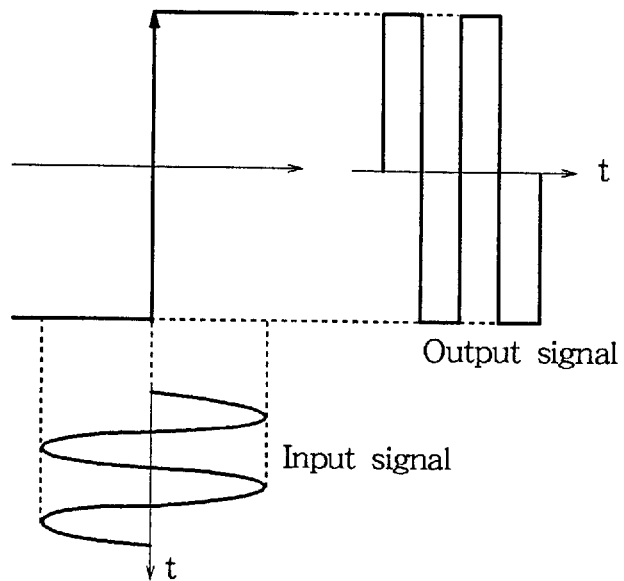
FIG. 14 is a similar operational diagram in case of a relatively great input amplitude without DC bias.

Next, the description is given for the operation of the FIG. 9 embodiment with reference to FIGS. 11–16. For facilitating better understanding of the operation, the first table RAM 22 stores an input/output conversion table having a particular characteristic curve shown illustratively in FIG. 11, which simulates a comparator. The input/output conversion characteristic curve of FIG. 11 has an extremely great distortion gain such that the signal waveform is completely clipped. In such a conversion characteristic, as shown in FIGS. 12–14, the output signal waveform is all the same while the amplitude level of the input signal varies provided that the harmonies modifier is not provided with DC bias means.

Figure 15:
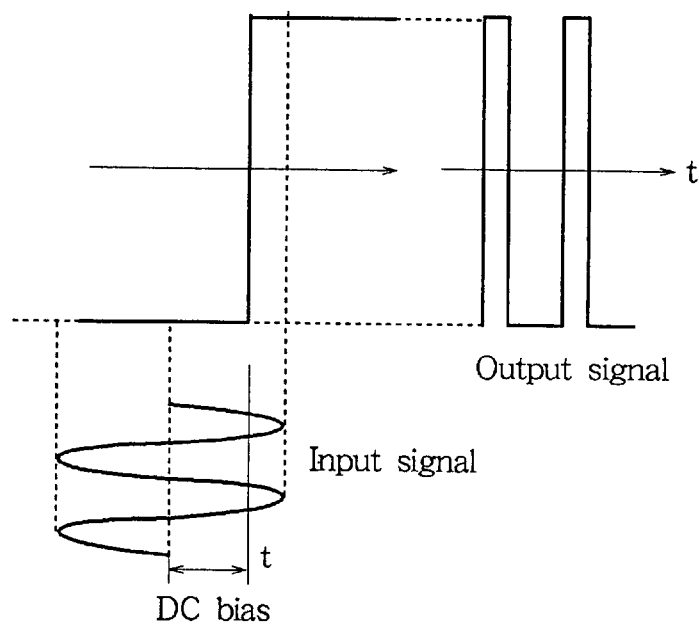
FIG. 15 is a similar operational diagram in case of a relatively great input amplitude with DC bias.
Figure 16:
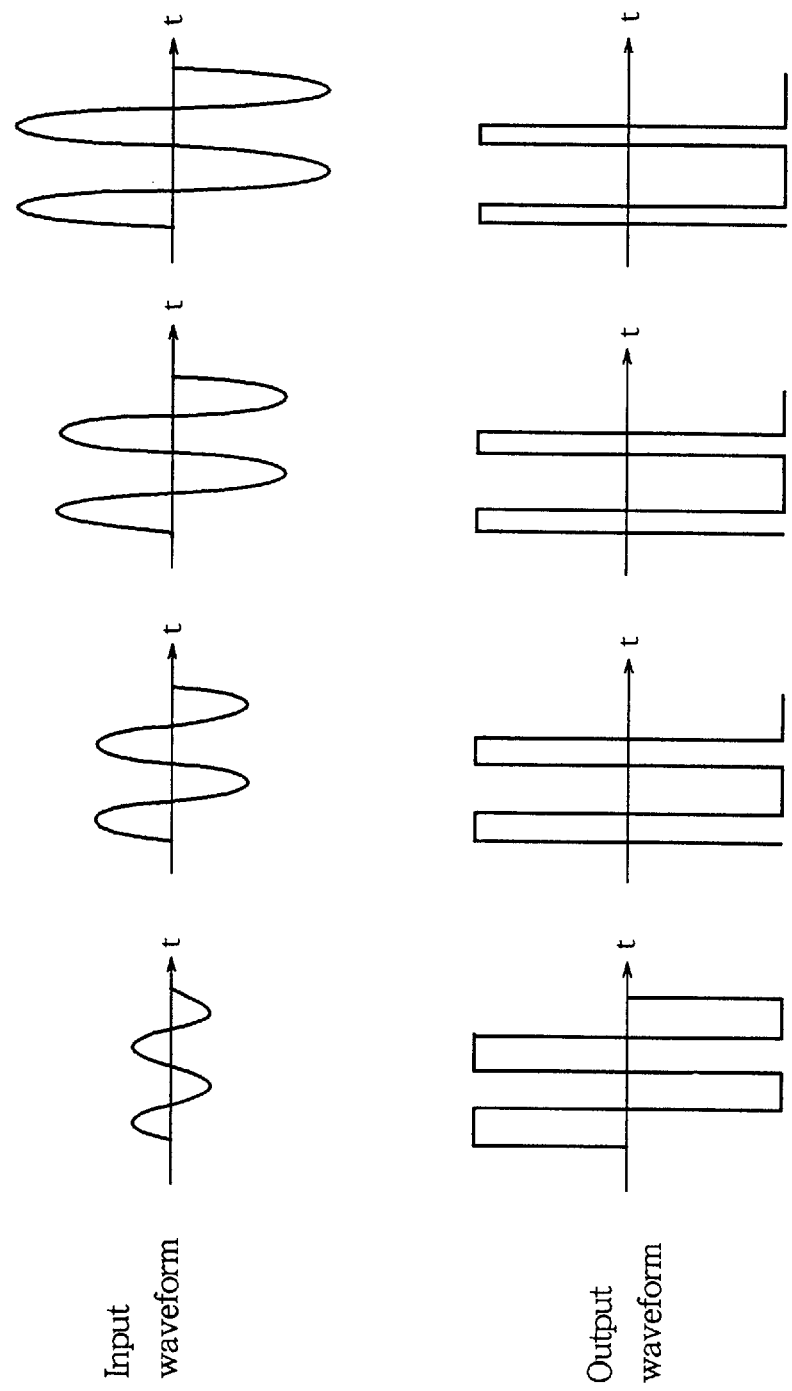
FIG. 16 is a diagram showing various input and output signal waveforms illustrating the typical operation of the FIG. 9 embodiment.

As opposed to the FIG. 14 condition, when an adequate DC bias is added to the input signal as shown in FIG. 15, there can be obtained a different output signal waveform from the same input/output conversion table. By utilizing such feature, the DC bias voltage applied to the input signal is varied according to the amplitude level of the input signal so as to further change timbre of the distortion sound having a clipped waveform. For example, FIG. 16 shows a preferred situation where the DC bias is increased as the input signal amplitude is raised. In general, the manner of varying the DC bias value is controlled by the contents of the amplitude/ bias conversion table stored in the second table RAM 24, and values of the capacitor C and the resistor Rg in the DC bias means. Timbre variation due to change of the output waveform can greatly improve strength of the distortion sound in the audio amplifier of a musical instrument.

Figure 17:
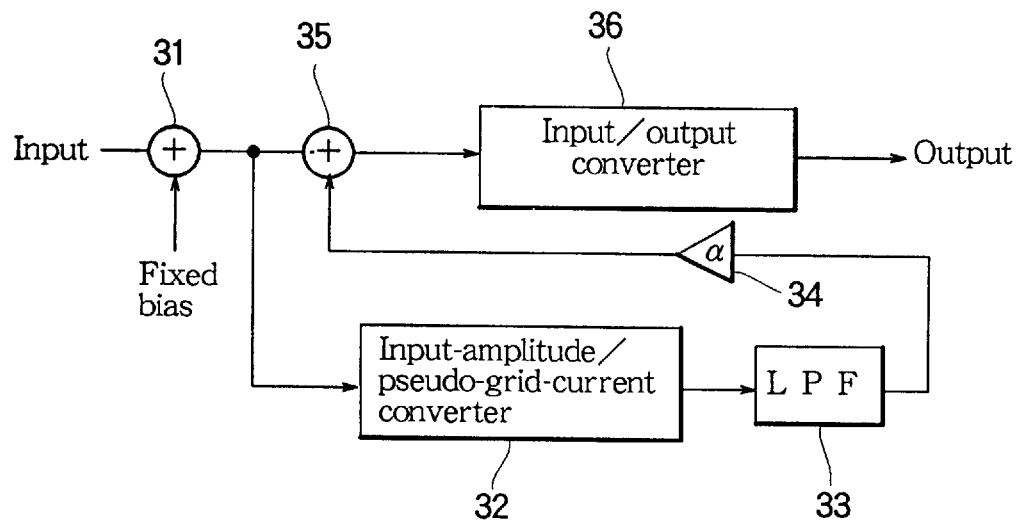
FIG. 17 is a block diagram showing an example of a DC bias application circuit adoptable in the FIG. 9 embodiment.

There may be other methods of varying the DC bias according to the input signal amplitude. For example, FIG. 17 shows one expedient where a low-pass filter (LPF) 33 is utilized to vary the DC bias. In this structure, a fixed bias is added precedingly to the input signal by an adder 31. Then, the input signal is treated by an input-amplitude/pseudo-grid-current converter 32 to produce a pseudo-grid-current by utilizing a look-up table which represents a certain input-current/grid-current characteristic of the vacuum-tube. The pseudo-grid-current is filtered by the LPF 33 to extract a direct current (DC) component. The DC component is multiplied with a given coefficient α by a multiplier 34 to provide a DC bias, which is added to the input signal by an adder 35. This DC-based input signal is processed by the harmonics modifier in the form of an input/output converter 36 utilizing an adequate input/output conversion look-up table to thereby produce an output signal.

Figure 18:
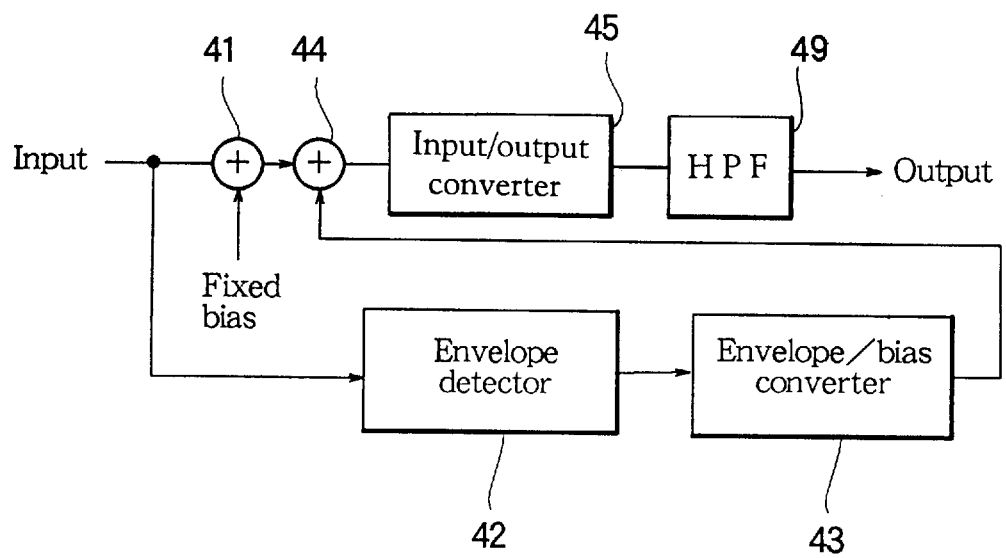
FIG. 18 is a block diagram showing another example of the DC bias application circuit adoptable in the FIG. 9 embodiment.

FIG. 18 shows another example where an envelope of the input signal is detected for varying a DC bias accordingly. In this structure, an evelope detector 42 is provided to detect the envelope of the initial input signal prior to addition of a fixed bias or offset by an adder 41. The detected envelope data is converted into a DC bias by an envelope/bias converter 43 utilizing an adequate look-up table. The DC bias is added by an adder 44 to the input signal which is precedingly added with the fixed bias by the adder 41. The DC-biased input signal is treated by an input/output converter 45 utilizing a given look-up table to thereby produce an output signal modified with harmonics.

Figure 19:
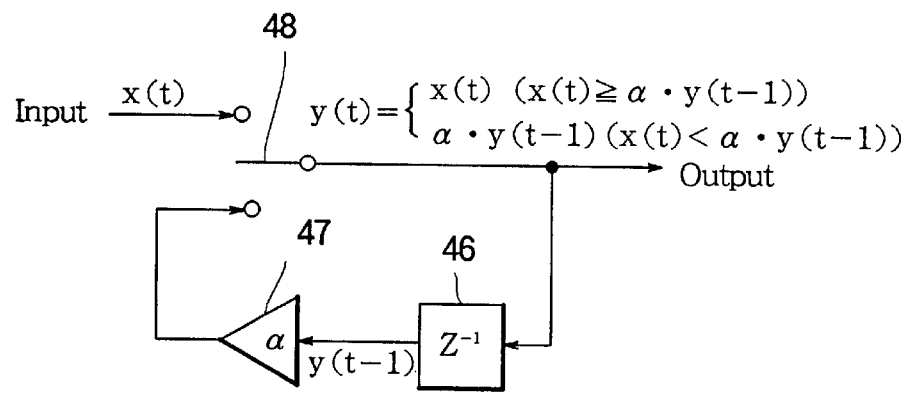
FIG. 19 is a block diagram showing an envelope detector provided in the FIG. 18 circuit.

FIG. 19 shows a detailed structure of the envelope detector 42 and illustrates an envelope detection process. Namely, the input signal x(t) is passed as it is to form the output signal of y(t)=x(t) in case of $x(t) \geq \alpha \cdot y(t-1)$. On the other hand, in case of $x(t) < \alpha \cdot y(t-1)$, the envelope detector produces the output signal of $y(t) = \alpha \cdot y(t-1)$. The value of a $\alpha \cdot y(t-1)$ is obtained by delaying one sample timing the output signal y(t) through a delay circuit 46 and then by multiplying the same by the given factor $\alpha$ through a multiplier 47. A selector 48 operates according to the above condition to selectively output either of $\alpha \cdot y(t-1)$ and x(t).

The harmonics modification is carried out by the input/output converter 45 after the input signal is added with the DC bias. In such a case, there might be caused drawbacks that a DC offset is transmitted to a subsequent device which utilizes the output signal. In order to avoid the drawbacks, the improved harmonics modifier having the DC bias means is provided at its output side with means for removing a DC component. For example, a high-pass filter (HPF) 49 is adopted to cut off the DC component.

Figure 20:
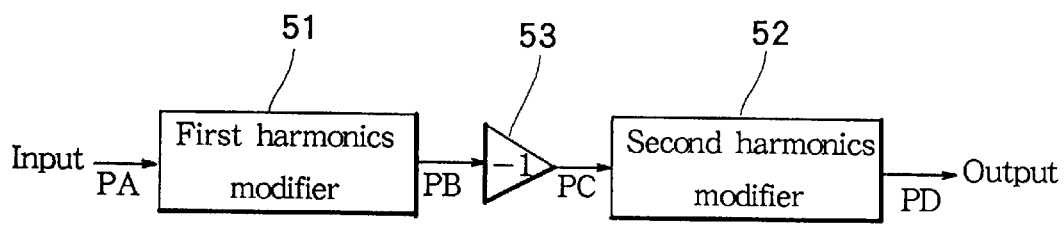
FIG. 20 is a block diagram showing a third embodiment of the inventive digital audio signal processor.

Next, the description is given for the third embodiment of the inventive digital audio signal processor, which is provided with a plurality of harmonics modifiers connected in series to one another while an intermediate signal is phase-inverted to thereby vary a distribution of harmonic components. Referring to FIG. 20, the digital audio signal processor is comprised of first and second harmonics modifiers 51, 52 each having the substantially same construction as that of the FIG. 9 modifier, and a phase inverter 53 interposed between the first and second harmonics modifiers. The first and second harmonics modifiers 51, 52 are connected in series to each other through the phase inverter 53 so as to more efficiently control variation of timbre.

Next, the description is given for operation of the FIG. 20 embodiment of the double stage construction in conjunction with FIGS. 21–25. The pair of harmonics modifiers 51, 52 utilize a given input/output conversion table having a conversion characteristic curve shown in FIG. 21. Namely, the utilized look-up table has a linear characteristic with a certain gain in a relatively small input range and a flat characteristic in a relatively great input range so as to clip an output waveform.

Figure 22:
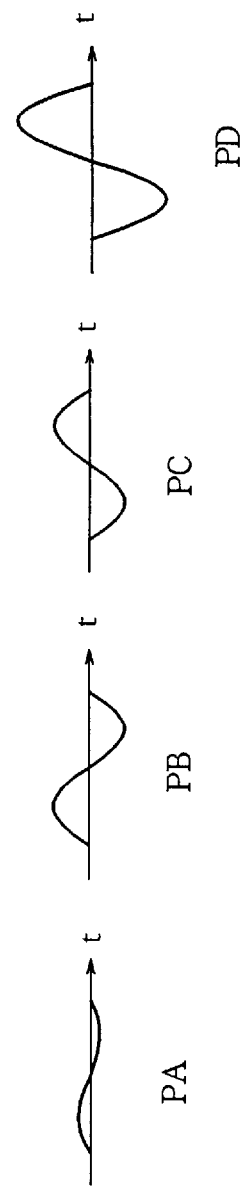
FIG. 22 is a diagram showing various signal waveforms illustrating the operation of the FIG. 20 embodiment in case of a relatively small input amplitude.

Firstly, FIG. 22 shows signal waveforms observed in case of a relatively small input level at various nodes of the FIG. 20 circuit, including an input node PA, an output node PB of the first harmonics modifier 51, an output node PC of the phase inverter 53, and a final output node PD of the second harmonics modifier 52.

Figure 23:
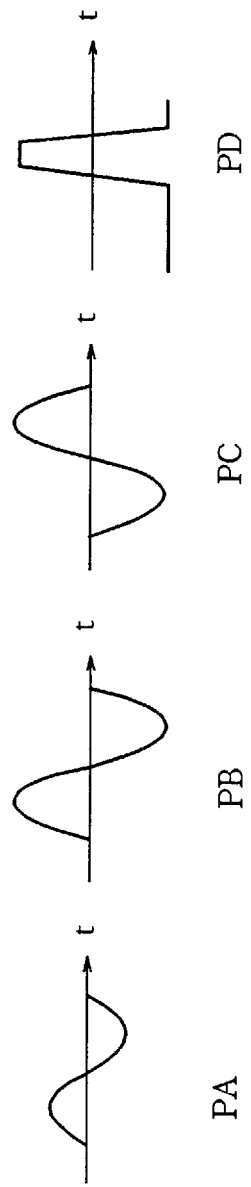
FIG. 23 is a similar waveform diagram observed in case of an intermediate input amplitude.

Next, FIG. 23 shows signal waveforms observed at the various nodes PA, PB, PC and PD in case that the input level moderately increases so that clipping and DC bias variation are occurring in the second harmonics modifier 52. Further, FIG. 24 shows signal waveforms observed in case that the input level considerably increases so that the clipping and the DC bias variation are occurring also in the first harmonics modifier 51.

Figure 24:
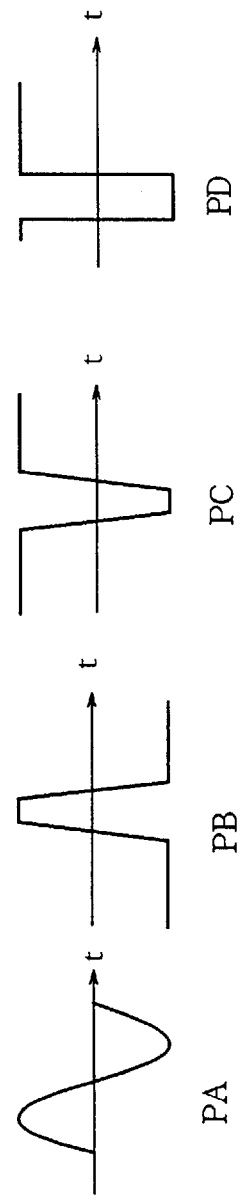
FIG. 24 is a similar waveform diagram observed in case of a relatively great input amplitude.
Figure 25:
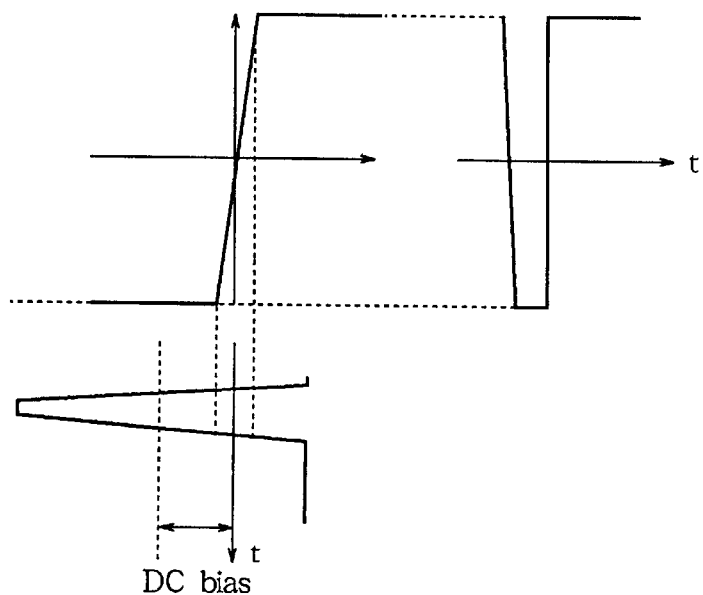
FIG. 25 is a diagram showing an input/output conversion characteristic of a second harmonics modifier provided in the FIG. 20 embodiment.

FIG. 25 shows the operation state of the second harmonics modifier 52 in the FIG. 24 condition. As understood from this figure, when the second harmonica modifier receives an input signal having the clipped waveform, the DC bias application effect does not occur substantially. Accordingly in the series connection of the hamonics modifiers, the preceding modifier has a greater DC bias application effect than that of the succeeding modifier. Further, variations of a duty ratio of the modified waveforms are opposite to each other between the preceding and succeeding stages because of the intermediate phase inversion. Consequently, in the series connection structure, the succeeding stage changes the duty ratio of the output waveform according to the DC bias application when the input level is relatively low. Then, the duty ratio can be restored by the DC bias application effect of the preceding stage in response to the input level. Further, the duty ratio can be changed reversely when the input level goes high. The above described harmonics modification phases are substantially separately controlled by corresponding stages of the modifiers to thereby facilitate the harmonics control. In addition, a number of stages may be increased to effect more delicate harmonics control.

Figure 26:
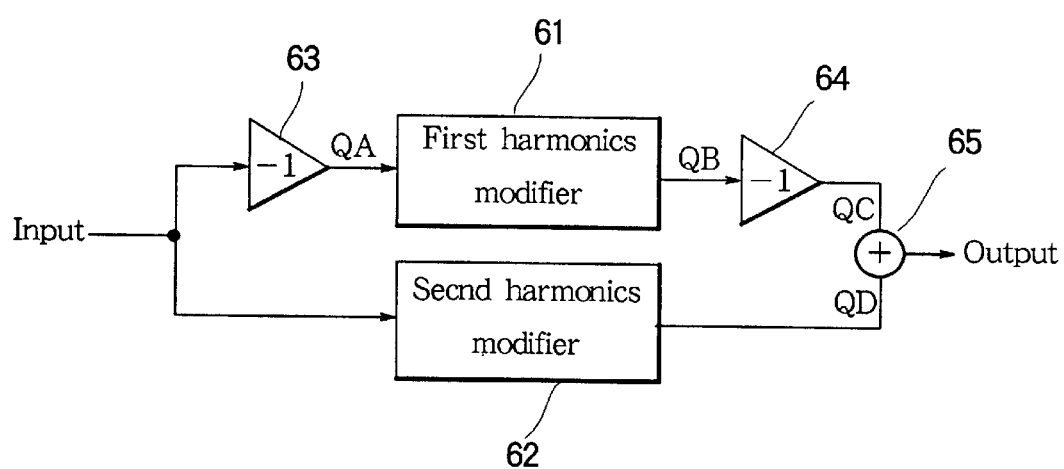
FIG. 26 is a block diagram showing a fourth embodiment of the inventive digital audio signal processor.

Next, the description is given for the fourth embodiment of the inventive digital audio signal processor, which comprises at least a pair of harmonics modifiers having the substantially same structure as those of the first and second embodiments. One of the modifiers has inverted input and output terminals, and another modifier is connected in parallel to that inversion type modifier. Referring to FIG. 26, a pair of first and second harmonics modifiers 61, 62 having the same structure as the FIG. 9 embodiment are coupled in parallel to each other. A pair of phase inverters 63, 64 are connected to input and output terminals of the first harmonics modifier 61. respectively An adder 65 is connected to the output of the phase inverter 64 and to the output of the second harmonics modifier 62.

Figure 21:
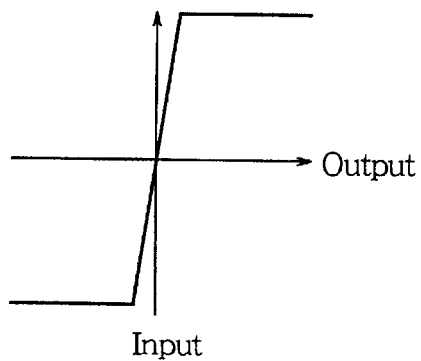
FIG. 21 is a diagram showing a characteristic curve of the input/output conversion table provided in the FIG. 20 embodiment.
Figure 27:
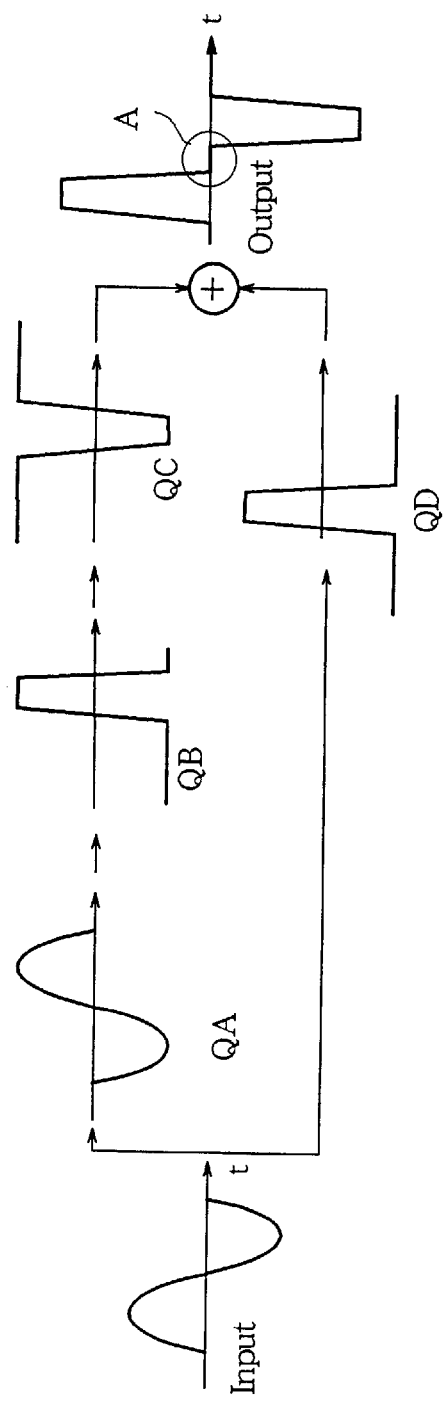
FIG. 27 is a diagram showing various waveforms illustrative of the operation of the FIG. 26 embodiment.
Figure 28:
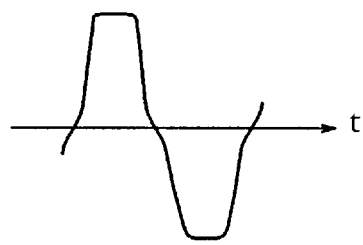
FIG. 28 is a diagram showing an output waveform of a vacuum-tube audio amplifier.

The recognized good quality of the distortion sound by the vacuum-tube amplifier partly originates from a distortion by a power amplifier. The power amplifier is generally comprised of a push/pull circuit. In view of this, the fourth embodiment is constructed as shown in FIG. 26 to effect digital push/pull operation in order to realize such a good quality of the conventional vacuum-tube amplifier. FIG. 27 shows signal waveforms observed during the course of distortion sound reproduction in the FIG. 26 embodiment at various points including start input node, output node QA of the phase inverter 63, output node QB of the first harmonics modifier 61, output node QC of the phase inverter 64, output node QD of the second harmonics modifier 62 and final output node. In this operation, the signal waveform at the final output node has a step portion A, which significantly improves quality of the distortion sound. For the simplicity of the description of the present embodiment, the utilized input/output conversion table has a characteristic curve as shown in FIG. 21, hence the final output waveform has the rather emphasized step portion A. In the practical vacuum-tube amplifier, the output waveform has a moderate and smooth step portion as shown in FIG. 28. Such a smooth step portion can be realized by suitably setting the contents of the input/output conversion table. Since the step portion is generated by varying the DC bias added to the input signal, it may be possible to eliminate the step portion when the input signal is relatively small. Such a control may be effected by suitably altering the contents of the amplitude/bias conversion table.

Figure 29:
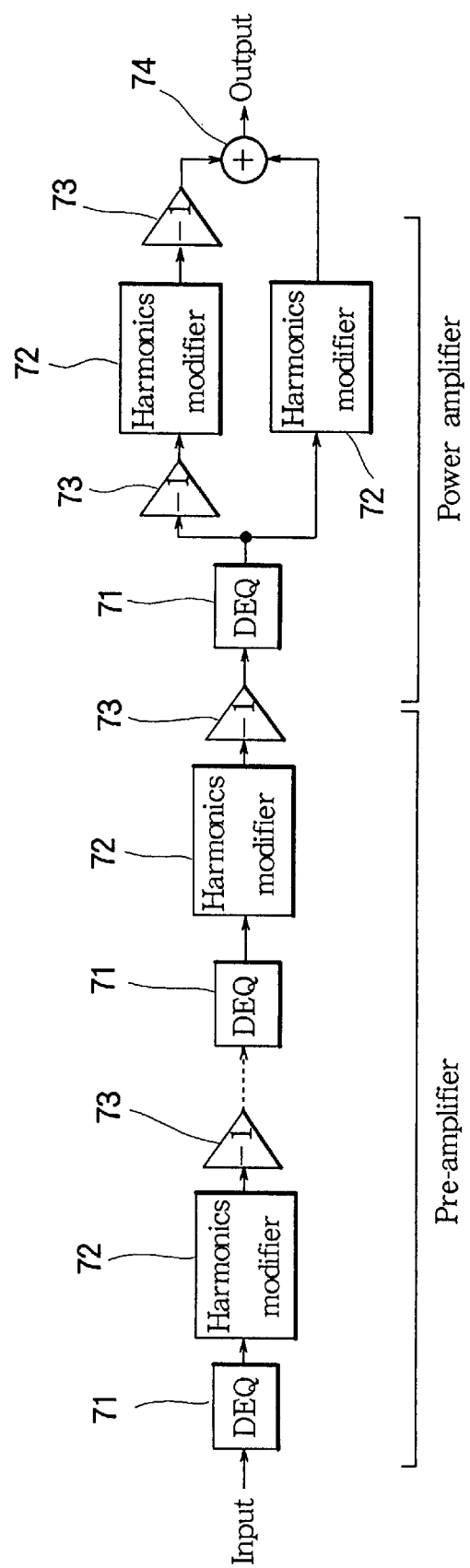
FIG. 29 is a block diagram showing a fifth embodiment of the inventive digital audio signal processor.

Lastly, the description is given for the fifth embodiment of the invention, which is a combination of the FIG. 20 construction and the FIG. 26 construction with digital equalizers (DEQ) to constitute an amplifier simulation circuit as shown in FIG. 29. The simulation circuit is comprised of digital equalizers 71, harmonics modifiers 72, phase inverters 73 and adder 74. The FIG. 29 circuit is divided into a pre-amplifier composed of a serial connection similar to the FIG. 20 embodiment and a power amplifier composed of the last stage equalizer 71 and the parallel connection of a push/pull circuit similar to the FIG. 26 embodiment. This structure can simulate various types of conventional amplifiers by controlling parameters, input/output conversion table, amplitude/bias conversion table and equalizer characteristics.

The present invention is not limited to the above described embodiments, but may be applied to various modifications to produce new interesting sounds. For example, the inventive harmonics modifier can be combined to the conventional distortion circuit such as the vacuum-tube amplifier and the semiconductor waveform clipper.

As described above, according to the invention, the digital audio signal processor can form interesting sounds containing various harmonic components. Further, the inventive harmonics modifier has high reliability and durability.

What is claimed is:

1. An audio signal processor having a harmonies modifier for processing an input audio signal to produce an output audio signal, wherein the harmonics modifier comprises:

translating means for sequentially translating the input audio signal into an address signal according to a sampled amplitude of the input audio signal;

memory means for storing an input/output conversion table containing amplitude values in addressable manner;

conversion means for accessing the memory means in response to the address signal to effect input/output conversion to read out a sequence of the amplitude values which form the output audio signal containing desired harmonic components according to results of the input/output conversion; and DC bias means disposed upstream of the translating means for adding a variable DC bias to the input audio signal, the variable DC bias being varied according to an amplitude level of the input signal, thereby varying a distribution of the harmonic components contained in the output audio signal, wherein the DC bias means includes an amplitude/bias conversion table used for conversion of the amplitude level of the input audio signal into the variable DC bias, the amplitude/bias conversion table representing an input-voltage/grid-current characteristic of a vacuum-tube amplifier.

2. An audio signal processor having a harmonics modifier for processing an input audio signal to produce an output audio signal, wherein the harmonics modifier comprises:

translating means for sequentially translating the input audio signal into an address signal according to a sampled amplitude of the input audio signal;

memory means for storing an input/output conversion table containing amplitude values in an addressable manner;

conversion means for accessing the memory means in response to the address signal to effect input/output conversion to read out a sequence of the amplitude values which form the output audio signal containing desired harmonic components according to results of the input/output conversion;

DC bias means disposed upstream of the translating means for adding a variable DC bias to the input audio signal, the variable DC bias being varied according to an amplitude level of the input signal, thereby varying a distribution of the harmonic components contained in the output audio signal;

a plurality of harmonics modifiers connected in series to one another; and an inverter interposed between preceding and succeeding harmonics modifiers for inverting a phase of a transmitted signal from the preceding harmonics modifier to the succeeding harmonics modifier.

3. An audio signal processor having a harmonics modifier for processing an input audio signal to produce an output audio signal, wherein the harmonics modifier comprises:

translating means for sequentially translating the input audio signal into an address signal according to a sampled amplitude of the input audio signal;

memory means for storing an input/output conversion table containing amplitude values in an addressable manner;

conversion means for accessing the memory means in response to the address signal to effect input/output conversion to read out a sequence of the amplitude values which form the output audio signal containing desired harmonic components according to results of the input/output conversion;

DC bias means disposed upstream of the translating means for adding a variable DC bias to the input audio signal, the variable DC bias being varied according to an amplitude level of the input signal, thereby varying a distribution of the harmonic components contained in the output audio signal; and at least one pair of harmonics modifiers connected in parallel to each other, one of the at least one pair of harmonics modifier having phase-inverters connect at its input and output terminals, and another of the at least one pair of harmonics modifier having no phase-inverter.

4. An audio signal processor according to claim 1, further including a first plurality of harmonics modifiers connected in series to one another, and a second plurality of harmonics modifiers connected in parallel to one another.

5. An audio signal processor having a harmonics modifier for processing an input audio signal to produce an output audio signal, wherein the harmonics modifier comprises:

translating means for sequentially translating the input audio signal into an address signal according to a sampled amplitude of the input audio signal;

memory means for storing an input/output conversion table containing amplitude values in an addressable manner;

conversion means for accessing the memory means in response to the address signal to effect input/output conversion to read out a sequence of the amplitude values which form the output audio signal containing desired harmonic components according to results of the input/output conversion;

DC bias means disposed upstream of the translating means for adding a variable DC bias to the input audio signal, the variable DC bias being varied according to an amplitude level of the input signal, thereby varying a distribution of the harmonic components contained in the output audio signal; and a serial connection of harmonics modifiers and equalizers to form a pre-amplifier; and a parallel connection of harmonics modifiers having selectively inverted terminals and non-inverters terminals to form a power amplifier, wherein the pre-amplifier and the power amplifier are coupled to each other to constitute an amplification simulator.

6. A digital audio signal processor having a harmonics modifier for processing a digital input audio signal to produce a digital output audio signal, wherein the harmonics modifier comprises:

sampling means operative at a sampling frequency for sequentially sampling an input amplitude level of the digital input audio signal at each sample timing;

DC bias computing means for computing a variable DC bias based on a predetermined formula according to the input amplitude level sampled by the sampling means;

adding means for adding the computed DC bias to the digital input audio signal;

nonlinear conversion means for nonlinearly converting the digital input audio signal added with the computed DC bias into the digital output audio signal;

a plurality of harmonics modifiers connected in series to one another; and an inverter interposed between preceding and succeeding modifiers for inverting a phase of a transmitted signal from the preceding harmonics modifiers to the succeeding harmonics modifier.

7. A digital audio signal processor according to claim 6, further including means for adding a fixed DC bias to the digital input audio signal.

8. A digital audio signal processor having a harmonics modifier for processing a digital input audio signal to produce a digital output audio signal, wherein the harmonics modifier comprises:

sampling means operative at a sampling frequency for sequentially sampling an input amplitude level of the digital input audio signal at each sample timing;

DC bias computing means for computing a variable DC bias based on a predetermined formula according to the input amplitude level sampled by the sampling means;

adding means for adding the computed DC bias to the digital input audio signal;

nonlinear conversion means for nonlinearly converting the digital input audio signal added with the computed DC bias into the digital output audio signal; and a pair of harmonics modifiers connected in parallel to each other, one harmonics modifiers having phase-inverters connected at its input and output terminals, and another harmonics modifier having no phase-inverter.

9. A digital audio signal processor according to claim 8, further including means for adding a fixed DC bias to the digital input audio signal.

10. A digital audio signal processor having a harmonics modifier for processing a digital input audio signal to produce a digital output audio signal, wherein the harmonics modifier comprises:

sampling means operative at a sampling frequency for sequentially sampling an input amplitude level of the digital input audio signal at each sample timing;

DC bias computing means for computing a variable DC bias based on a predetermined formula according to the input amplitude level sampled by the sampling means;

adding means for adding the computed DC bias to the digital input audio signal;

nonlinear conversion means for nonlinearly converting the digital input audio signal added with the computed DC bias into the digital output audio signal;

a first plurality of harmonics modifiers connected in series to one another; and a second plurality of harmonics modifiers connected in parallel to one another.

11. A digital audio signal processor according to claim 10, further including means for adding a fixed DC bias to the digital input audio signal.

12. A method of modifying an audio signal with harmonic components, comprising the steps of:

preparing an input/output conversion table containing amplitude values in addressable manner;

setting a variable DC bias in accordance with an amplitude of an input audio signal;

adding the variable DC bias to the input audio signal;

sequentially translating the biased input audio signal into an address signal according to a sampled amplitude of the biased input audio signal; and accessing the input/output conversion table in response to the address signal to read out a sequence of the amplitude values which form an output audio signal containing desired harmonic components, wherein the variable DC bias circuit includes an amplitude/bias conversion table used for conversion of the amplitude level of the input audio signal into the variable DC bias, the amplitude/bias conversion table representing an input-voltage/grid-current characteristic of a vacuum-tube amplifier.

13. An audio signal processor having a harmonics modifier for processing an input audio signal to produce an output audio signal, wherein the harmonics modifier comprises:

a variable DC bias circuit that determines a variable DC bias based upon the amplitude of the input audio signal and a previous bias, the variable DC bias circuit then adding the variable DC bias to the input audio signal to produce an adjusted input signal;

a processor circuit that converts the adjusted input signal into an address signal in accordance with an amplitude of the adjusted input signal;

a memory device containing an input/output conversion table formed by a plurality of amplitude conversion values; and a conversion circuit that accesses the memory device based upon the address signal to effect an input/output conversion by obtaining one of the plurality of amplitude conversion values from the memory device, the conversion circuit then outputting the obtained one of the plurality of amplitude conversion values as the output audio signal containing the desired harmonic components that are produced in accordance with the input/output conversion, wherein the variable DC bias circuit includes an amplitude/bias conversion table used for conversion of the amplitude level of the input audio signal into the variable DC bias, the amplitude/bias conversion table representing an input-voltage/grid-current characteristic of a vacuum-tube amplifier.

14. An audio signal processor having a harmonics modifier for processing an input audio signal to produce an output audio signal, wherein the harmonics modifier comprises:

a variable DC bias circuit that determines a variable DC bias based upon the amplitude of the input audio signal and a previous bias, the variable DC bias circuit then adding the variable DC bias to the input audio signal to produce an adjusted input signal;

a processor circuit that converts the adjusted input signal into an address signal in accordance with an amplitude of the adjusted input signal;

a memory device containing an input/output conversion table formed by a plurality of amplitude conversion values;

a conversion circuit that accesses the memory device based upon the address signal to effect an input/output conversion by obtaining one of the plurality of amplitude conversion values from the memory device, the conversion circuit then outputting the obtained one of the plurality of amplitude conversion values as the output audio signal containing the desired harmonic components that are produced in accordance with the input/output conversion;

a plurality of harmonics modifiers connected in series to one another; and an inverter interposed between preceding and succeeding harmonics modifiers for inverting a phase of a transmitted signal from the preceding harmonics modifier to the succeeding harmonics modifier.

15. An audio signal processor having a harmonics modifier for processing an input audio signal to produce an output audio signal, wherein the harmonics modifier comprises:

a variable DC bias circuit that determines a variable DC bias based upon the amplitude of the input audio signal and a previous bias, the variable DC bias circuit then adding the variable DC bias to the input audio signal to produce an adjusted input signal;

a processor circuit that converts the adjusted input signal into an address signal in accordance with an amplitude of the adjusted input signal;

a memory device containing an input/output conversion table formed by a plurality of amplitude conversion values;

a conversion circuit that accesses the memory device based upon the address signal to effect an input/output conversion by obtaining one of the plurality of amplitude conversion values from the memory device, the conversion circuit then outputting the obtained one of the plurality of amplitude conversion values as the output audio signal containing the desired harmonic components that are produced in accordance with the input/output conversion; and at least one pair of harmonics modifiers connected in parallel to each other, one of the at least one pair of harmonics modifier having phase-inverters connect at its input and output terminals, and another of the at least one pair of harmonics modifier having no phase-inverter.

16. An audio signal processor according to claim 11, further including a first plurality of harmonics modifiers connected in series to one another, and a second plurality of harmonic modifiers connected in parallel to one another.

17. An audio signal processor having a harmonics modifier for processing an input audio signal to produce an output audio signal, wherein the harmonics modifier comprises:

a variable DC bias circuit that determines a variable DC bias based upon the amplitude of the input audio signal and a previous bias, the variable DC bias circuit then adding the variable DC bias to the input audio signal to produce an adjusted input signal;

a processor circuit that converts the adjusted input signal into an address signal in accordance with an amplitude of the adjusted input signal;

a memory device containing an input/output conversion table formed by a plurality of amplitude conversion values; and a conversion circuit that accesses the memory device based upon the address signal to effect an input/output conversion by obtaining one of the plurality of amplitude conversion values from the memory device, the conversion circuit then outputting the obtained one of the plurality of amplitude conversion values as the output audio signal containing the desired harmonic components that are produced in accordance with the input/output conversion;

a serial connection of harmonics modifiers and equalizers to form a pre-amplifier; and a parallel connection of harmonics modifiers having selectively inverted terminals and non-inverted terminals to form a power amplifier, wherein the pre-amplifier and the power amplifier are coupled to each other to constitute an amplification simulator.

18. An audio signal processor according to claim 1, wherein the conversion means for the harmonics modifier includes reading means for interpolatively reading out the amplitude.

19. An audio signal processor according to claim 1, wherein the DC bias means further includes means for adding a fixed DC bias to the input audio signal.

20. An audio signal processor according to claim 1, wherein the harmonics modifier further includes removing means disposed downstream of the conversion means for removing a DC component from the output audio signal so as to prevent an affect of a DC offset.

21. An audio signal processor according to claim 20, wherein the removing means comprises a high-pass filter.

22. An audio signal processor according to claim 11, wherein the conversion circuit for the harmonics modifier includes an interpolation circuit for interpolatively reading out the amplitude value.

23. An audio signal processor according to claim 11, wherein the variable DC bias circuit further includes an input to add a fixed DC bias to the input audio signal.

24. An audio signal processor according to claim 11, wherein the harmonics modifier further includes a removing circuit disposed downstream of the conversion circuit for removing a DC component from the output audio signal so as to prevent an affect of a DC offset.

* * * * *